(12) United States Patent
Müller et al.

(10) Patent No.: US 6,965,228 B2
(45) Date of Patent: Nov. 15, 2005

(54) PROXIMITY SWITCH ENCAPSULATED IN A PLASTIC HOUSING AND HAVING A SHIELD

(75) Inventors: Jens Müller, Schwarzenberg (DE); Herbert Sowa, Schwarzenberg (DE)

(73) Assignee: Werner Turck GmbH & Co.KG, Halver (DE)

( * ) Notice: Subject to any disclaimer, the term of this patent is extended or adjusted under 35 U.S.C. 154(b) by 220 days.

(21) Appl. No.: 10/623,468

(22) Filed: Jul. 18, 2003

(65) Prior Publication Data

US 2005/0007224 A1    Jan. 13, 2005

(30) Foreign Application Priority Data

Jul. 23, 2002 (DE) .......................... 202 11 087 U

(51) Int. Cl.$^7$ ............................................... G01B 7/14
(52) U.S. Cl. ........................ 324/207.26; 324/207.16; 336/84 R
(58) Field of Search ....................... 324/207.11–207.26; 336/84 R

(56) References Cited

U.S. PATENT DOCUMENTS

| | | | | |
|---|---|---|---|---|
| 4,378,504 A | * | 3/1983 | Yamasaki | .................... 307/99 |
| 4,875,009 A | * | 10/1989 | Leveque | ................. 324/207.13 |
| 5,801,530 A | * | 9/1998 | Crosby et al. | ......... 324/207.26 |
| 2004/0135572 A1 | * | 7/2004 | Nakazaki | .................... 324/200 |

FOREIGN PATENT DOCUMENTS

| DE | 3014416 | 1/1981 |
|---|---|---|
| DE | 20019542 | 4/2002 |

* cited by examiner

*Primary Examiner*—Ramon M. Barrera
(74) *Attorney, Agent, or Firm*—Martin A. Farber

(57) ABSTRACT

A proximity switch having a coil former (3) which is fitted with at least one coil (4, 5, 6), has an associated board (8) and is held by a plastic housing (1), and having an electrically conductive shield (2) between the coil former (3) and the inner wall of the plastic housing (1), with the shield (2) making electrically conductive contact with a circuit (9) which is mounted on the board (8), wherein the shield (2) is formed by an electrically conductive inner wall coating on the plastic housing (1).

10 Claims, 2 Drawing Sheets

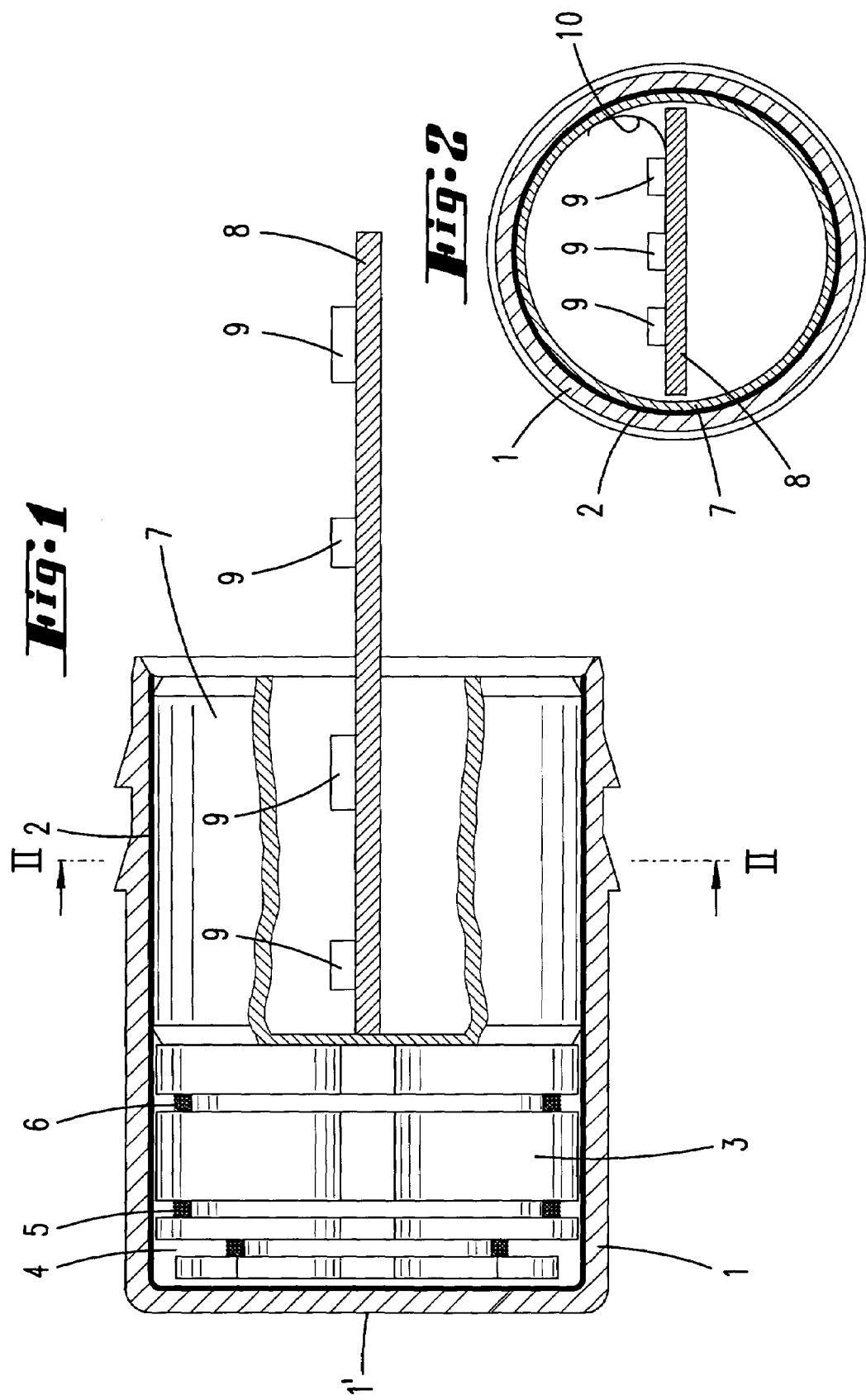

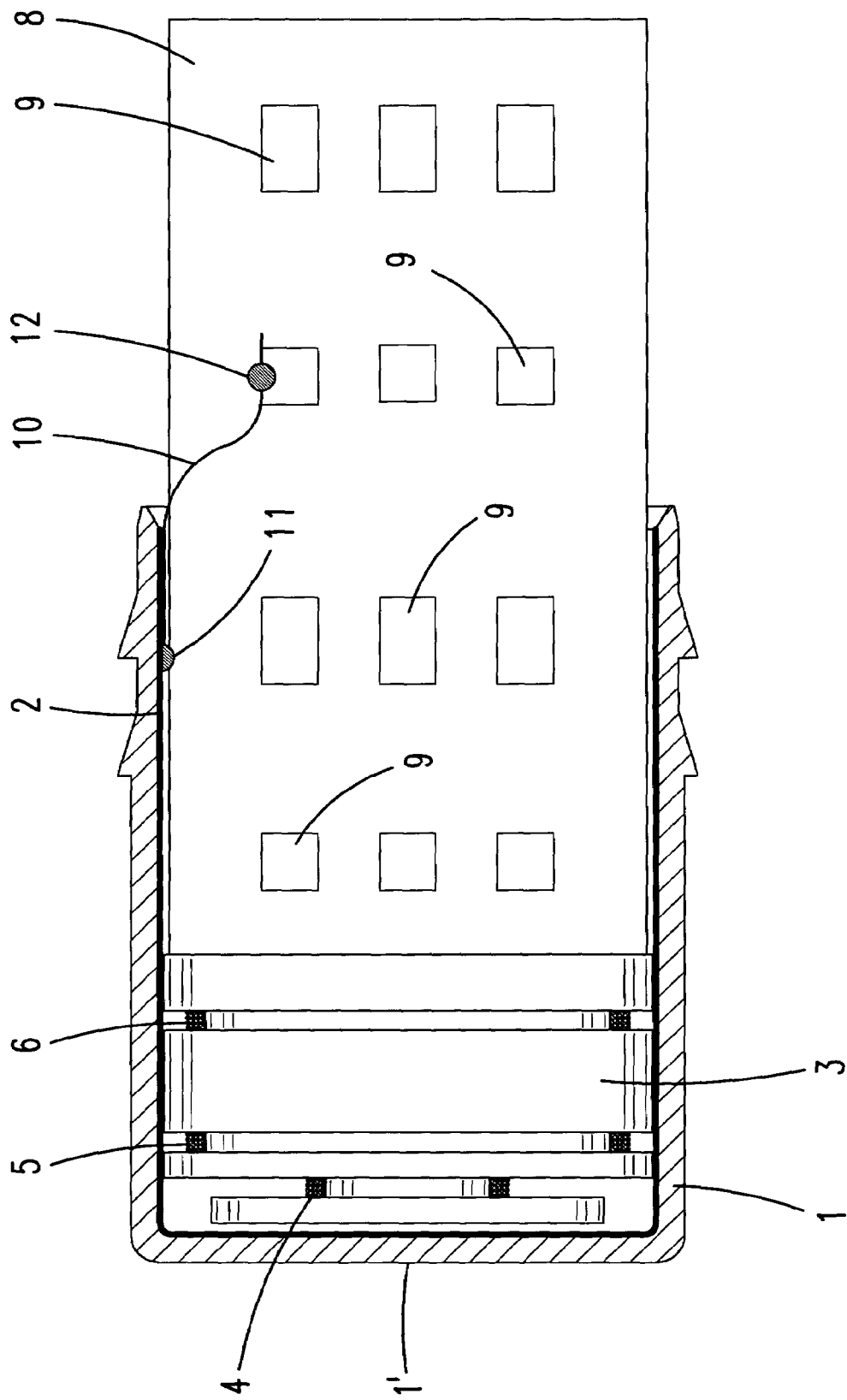

PROXIMITY SWITCH ENCAPSULATED IN A PLASTIC HOUSING AND HAVING A SHIELD

FIELD AND BACKGROUND OF THE INVENTION

The invention relates to a proximity switch having a coil former which is fitted with one or more coils, has an associated board and is held by a plastic housing, and having an electrically conductive shield between the coil former and the inner wall of the plastic housing, with the shield making electrically conductive contact with a circuit which is mounted on the board.

A proximity switch such as this is known from DE 200 19 542 U1. There, the shield is formed by a non-woven which is electrically conductive and is located in the space between the inner wall of the plastic housing and the coil former.

A proximity switch having a verification coil provided with a core and having a capacitor arranged on the core is already known from DE 30 14 416 C2. Together with the verification coil, the capacitor forms a resonant circuit, which is connected to an oscillating circuit. The verification coil is arranged in the core there. The outer surfaces of the core are covered by a conductive film, which is connected to ground, for electrostatic shielding. The shield there is a vapor-deposited metal film composed of chromium and palladium and has a thickness of between 60 nm and 200 nm.

SUMMARY OF THE INVENTION

The invention is based on the object of developing the proximity switch described initially not only in terms of manufacturing but also advantageously for use.

The object is achieved by the invention having the aim of the shield being formed by an electrically conductive inner wall coating on the plastic housing. A development provides for the coating to be composed of a resistance material, in particular of a copper nickel tin alloy. The alloy may in this case have the following specific composition: 38% copper, 42% nickel and 20% tin. Contact can be made between the inner wall coating and the electrical circuit by means of a metallic shielding ring, which surrounds the board. One variant of the invention provides for the contact between the inner wall coating and the electrical circuit to be made by a contact lug. In this case, provision is also made for the contact means, namely the contact lug, to be soldered to a contact on the electrical circuit. The contact lug is, furthermore, soldered to the coating. For this variant, this therefore means that it must be possible to solder the coating. In contrast to the coating which is known from DE 30 14 416 C2, the coating favored here is thicker than 200 nm. The layer thickness is, in particular, between 0.5 μm and 20 μm. Another major factor is that the material which is used for the coating is a resistance material. The resistance which is measured between two measurement probes which are placed on the cap base 5 mm apart and with a measurement current of about 1 mA is thus in the range between 10 Ω and 50 Ω. It is particularly advantageous for the measured resistance to be between 20 Ω and 30 Ω.

BRIEF DESCRIPTION OF THE DRAWINGS

Exemplary embodiments of the invention will be explained in the following text with reference to the attached FIGS. 1 to 3, in which:

FIG. 1 shows a first exemplary embodiment of the invention, in the form of a longitudinal section, FIG. 2 shows a section along the line II—II in FIG. 1, and FIG. 3 shows an illustration corresponding to FIG. 1 of a second exemplary embodiment, with the section in this case running parallel to the board, rather than through the board.

DETAILED DESCRIPTION OF THE PREFERRED EMBODIMENT

The proximity switch which is illustrated in the figures has a plastic housing in the form of a pot, whose end surface 1' is the active surface of the proximity switch. The housing 1 which is in the form of a pot is provided with a coating 2 on its inner wall. This coating 2 may be sprayed on or vapor-deposited. A resistance material may be used as the material for the coating. The coating material is composed in particular of the metals copper, nickel and tin. This copper nickel tin alloy extends over the entire inner wall of the housing 1, which is in the form of a pot. The coating 2 has a thickness which is greater than 200 nm. The layer thickness is preferably between 0.5 μm and 20 μm.

The conductance of the coating is relevant. The coating is metallically conductive. However, its resistivity is such that the operation of the proximity switch is not adversely affected although, on the other hand, interference signals are shielded. The composition of the layer, its thickness and its structure mean that no significant eddy currents can be formed which would adversely affect the operation of the sensor. The resistance which is measured between two measurement probes on the base of the pot, with the measurement probes being 5 mm apart from one another and with a measurement current of 1 mA flowing, is thus 10 Ω to 50 Ω. This resistance is preferably between 20 Ω and 30 Ω.

A coil former 3 is located within the housing 1 which is in the form of a pot. In the exemplary embodiment, the coil former 3 is fitted with three coils 4, 5, 6. A section of a board 8 projects into the plastic housing 1 to the rear of the coil former 3. The board 8 forms a mount for an electrical circuit which comprises two or more components 9, for evaluation of the signal, and/or for supplying AC voltage to a tuned circuit.

In the exemplary embodiment illustrated in FIG. 1, contact is made between the inner wall coating 2 and the board via a solid metallic shielding ring 7, which surrounds the board and is connected to the board via a contact lug 10. The shielding ring 7 rests on the inner wall coating 2, such that it touches it.

In the exemplary embodiment illustrated in FIG. 3, a solder lug 10 is soldered to the inner wall coating 2. It is therefore necessary to be able to solder the inner wall coating 2, in order to produce the solder contact point 11 for the contact lug 10. The reference number 12 indicates the contact by means of which the contact lug 10 is connected to the circuit 9.

All the disclosed features are (intrinsically) significant to the invention. The disclosure content of the application in this case also refers to the entire contents of the disclosure content from the associated/attached priority documents (copy of the prior application), also with the purpose of including features from these documents in claims for the present application.

We claim:

1. A proximity switch having a coil former (3) which is fitted with at least one coil (4, 5, 6), has an associated board (8) and is held by a plastic housing (1), and having an electrically conductive shield (2) between the coil former (3) and the inner wall of the plastic housing (1), with the shield (2) making electrically conductive contact with a circuit (9) which is mounted on the board (8), wherein the shield (2) is formed by an electrically conductive inner wall coating on the plastic housing (1).

2. The proximity switch as claimed in claim 1, wherein the coating is a copper nickel tin alloy.

3. The proximity switch as claimed in claim 1, wherein the coating has the following composition: 38% copper, 42% nickel and 20% tin.

4. The proximity switch as claimed in claim 1, further comprising a metallic shielding ring (7), which surrounds the electrical circuit (9), and serves as a connection between the shield (2) and the electrical circuit (9).

5. The proximity switch as claimed in claim 1, wherein the coating (2) can be soldered.

6. The proximity switch as claimed in claim 1 wherein the coating (2) is thicker than 200 nm.

7. The proximity switch as claimed in claim 1, wherein the thickness of the coating (12) is between 0.5 $\mu$m and 20 $\mu$m.

8. The proximity switch as claimed in claim 1, wherein the resistance of the coating, measured at a distance of 5 mm with a measurement current of 1 mA, is in the range between 10 $\Omega$ and 50 $\Omega$.

9. The proximity switch as claimed in claim 8, wherein the resistance of the coating is in a range between 20 $\Omega$ and 30 $\Omega$.

10. The proximity switch as claimed in claim 1, further comprising a contact lug (10) which is soldered to the coating for connecting the coating to the circuit (9).

* * * * *